(12) United States Patent
Nguyen

(10) Patent No.: US 6,560,730 B1
(45) Date of Patent: May 6, 2003

(54) METHOD AND APPARATUS FOR TESTING A NON-VOLATILE MEMORY ARRAY HAVING A LOW NUMBER OF OUTPUT PINS

(75) Inventor: Hung Nguyen, Fremont, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/507,234

(22) Filed: Feb. 18, 2000

(51) Int. Cl.[7] .............................................. G11C 29/00
(52) U.S. Cl. ........................................ 714/719; 365/201
(58) Field of Search ................................. 714/718–719; 365/185.22, 189.07, 201

(56) References Cited

U.S. PATENT DOCUMENTS

| | | | | |
|---|---|---|---|---|
| 5,787,038 A | * | 7/1998 | Park | 365/185.22 |
| 5,928,373 A | * | 7/1999 | Yoo | 714/719 |
| 6,069,822 A | * | 5/2000 | Canegallo | 365/185.22 |
| 6,122,197 A | * | 9/2000 | Sinai et al. | 365/185.22 |

* cited by examiner

*Primary Examiner*—Albert Decady
*Assistant Examiner*—Shelly A Chase
(74) *Attorney, Agent, or Firm*—Gray Cary Ware & Freidenrich LLP

(57) ABSTRACT

A high speed tester for a serial output non-volatile memory array comprises a plurality of latches in the memory device for storing a plurality of signals. A plurality of comparators are also placed in the memory device. Each comparator receives an output of a sense amplifiers and the test signal stored in the latch and compares them. The result of a simultaneous comparison of the signals from the plurality of latches and of the signals from the plurality of sense amplifiers indicating the reading of a plurality of memory cells is then supplied to a logic circuit which ANDs the plurality of test result signals and generates an output signal which is supplied on the data output pin. This greatly increases the throughput of testing.

10 Claims, 1 Drawing Sheet

METHOD AND APPARATUS FOR TESTING A NON-VOLATILE MEMORY ARRAY HAVING A LOW NUMBER OF OUTPUT PINS

TECHNICAL FIELD

The present invention relates to a method and apparatus for testing a non-volatile memory array and more particularly for testing a non-volatile memory array of the type having a low number of output pins, such as a non-volatile memory array having a serial output of data.

BACKGROUND OF THE INVENTION

Non-volatile memory devices are well-known in the art. In the prior art, to test the memory cells of a non-volatile memory array in the device, the tester typically writes data having a test pattern into the non-volatile memory device. The memory cells which store the test pattern are then read out of the device and are then compared to the expected test pattern. If the comparison shows a flaw, then certain of the memory cells of the memory array in the device are flawed.

Because the testing of the memory cells of a non-volatile memory device involves the writing of a number of different test pattern data into the memory and then reading the data out, the testing of the memory cells of a non-volatile memory array is one of the bottlenecks.

The bottleneck for testing the memory cells of a non-volatile memory array is further exacerbated if the memory device is one that has a low pin output count, such as a serial device. In a serial device, typically, one data pin output is provided and data from the memory cells of the memory array must be read out serially. In a typical test procedure to test the memory cells of a serial output non-volatile memory device, the bit data is serially outputted from the memory device one at a time until an entire byte is read out with the byte of data preceded and followed an acknowledgment signal. Thus, due to the limited access of data from the memory device to the outside world of tester, this creates a bottleneck to the high speed testing of the non-volatile memory device.

SUMMARY OF THE INVENTION

Accordingly, in the present Invention, a method and apparatus are provided to test a non-volatile memory device. The non-volatile memory device has an array of non-volatile memory cells which are arranged in a plurality of columns and rows. A plurality of sense amplifiers are provided with one associated with each column. Each of the sense amplifiers receives the signal read from a memory cell in the associated column. A plurality of latches for storing a plurality of test signals are also provided. A plurality of comparators are also provided. One comparator is associated with each latch and with each sense amplifier for receiving the signals therefrom and for comparing same and for generating a test result signal. A logic circuit receives a plurality of the test result signals which are the outputs of the plurality of comparators and generates an output signal in response thereto. The output signal is supplied on an output pin.

BRIEF DESCRIPTION OF THE DRAWINGS

Referring to the FIGURE there is shown a detailed circuit diagram of the improved non-volatile memory device of the present invention.

DETAILED DESCRIPTION OF THE DRAWING

Figure 1:
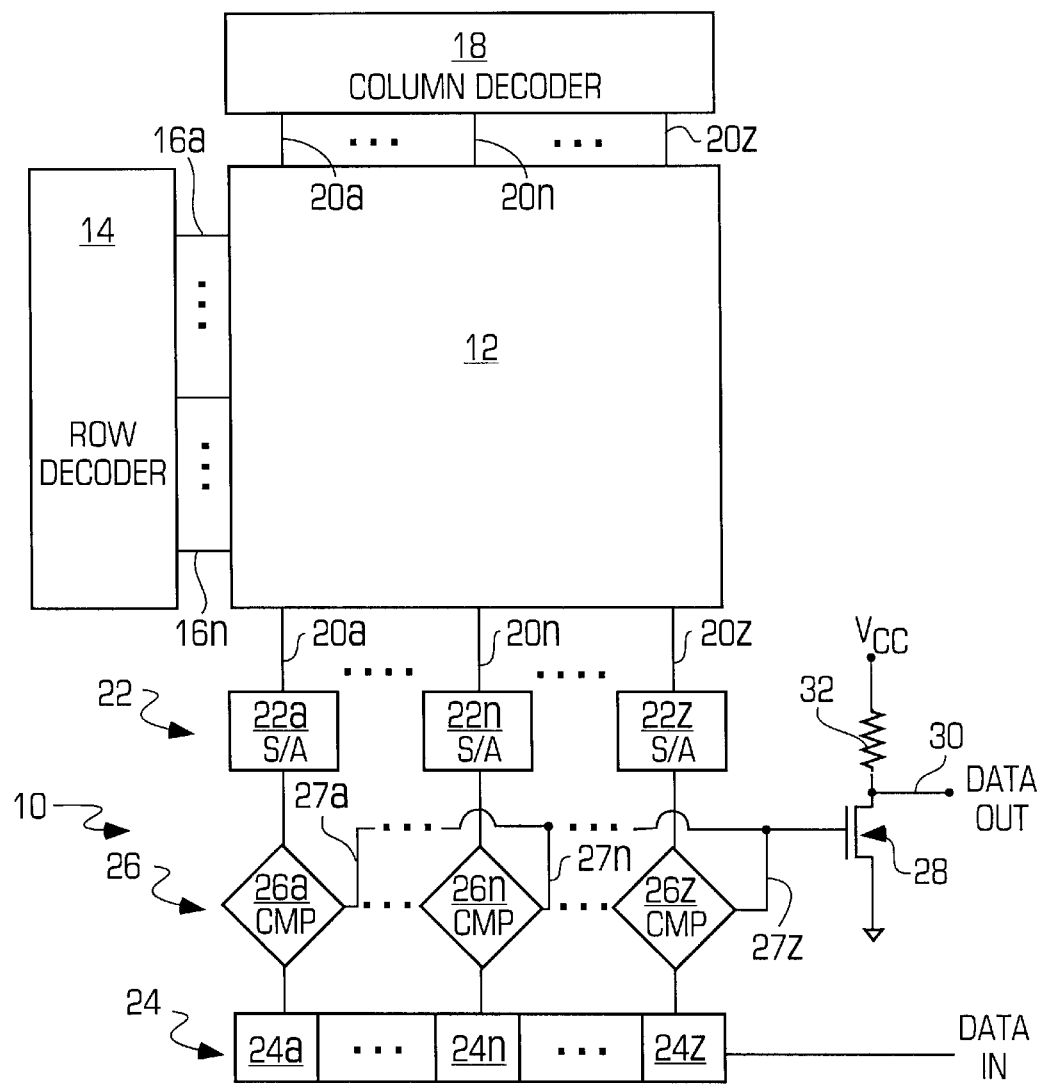

Referring to the FIGURE, there is shown a detailed circuit diagram of the improved memory device 10 of the present invention. The non-volatile memory device 10 in the preferred embodiment is an integrated circuit having all the electrical circuit components fabricated on a single semiconductor substrate. The device 10 comprises a conventional array 12 of non-volatile memory cells which are arranged in a plurality of columns and rows. The array 12 is accessed by a row decoder 14 which receives an address signal (not shown) and decodes the address signal and provides the decoded address signal on the plurality of row lines 16($a$–$n$). A column decoder 18, also of conventional design, decodes the address signal supplied to the column decoder 18 and supplies the decoded address signals on the column lines 20$a$–20$z$, all of which are well known in the art.

The device 10 further comprises well known conventional sense amplifiers 22($a$–$z$) with one sense amplifier associated with and connected to a column line 20 for receiving the signal read from a memory cell in that column 20.

A plurality of latches 24 are provided. Each of the latches 24 can be a volatile memory cell and in the preferred embodiment is an SRAM cell. Each of the latches 24 receives a test signal from the data in pin of the memory device 10 and stores the test signal. In the preferred embodiment, there are as many latches 24 as there are sense amplifiers 22.

The memory device 10 further comprises a plurality of comparators 26. Each comparator, e.g. 26$a$ is associated with a sense amplifier, e.g. 22$a$ and a latch, e.g. 24$a$. Each comparator 26 receives the output of the associated sense amplifier 22 and receives the signal stored in the latch 24 and compares them and generates a test result signal 27. The plurality of test result signals 27($a$–$z$) from the plurality of comparators (26$a$–$z$) are connected together and are supplied to the gate of an NMOS transistor 28. The NMOS transistor 28 acts to logically AND the test result signals 27($a$–$z$). One terminal of the NMOS transistor 28 is connected to ground. The other terminal of the NMOS transistor 28 is connected to Vcc through a pull up resistor 32. Finally, the other terminal is supplied to the data out pin of the memory device 10.

In the operation of the memory device 10, the test signals are supplied along the data in pin to the memory device 10 and are stored in the plurality of latches 24. In addition, the test signals are also stored in the non-volatile memory cells to be tested within the array 12. The circuit to accomplish that is well known in the art and is not shown. Once the particular test pattern of test signals is stored in the particular memory cells in the memory array 12, they are then read out and are sensed by the sense amplifiers 22. The outputs of the sense amplifiers 22 are supplied to the comparators 26 to which the test signals from the latches 24 are also supplied. The plurality of comparators 26 compares simultaneously each one of the memory signals from the associated memory cell as sensed by sense amplifier 22 with the associated test signals stored in the latch 24 to generate a plurality of test result signals 27. Since the plurality of test result signals 27 from the outputs of the comparators 26 are all connected together to the gate of the transistor 28, if all of the test result signals are low indicating that each of the memory signals from the memory cells was successfully compared to the test signal from the latch 24, then the result signal 30 from the MOS transistor 28 supplied on the data out pin is high. On the other hand, if the read out of only one memory cell fails in its comparison with the test signal stored in the latch 24, then the output of that comparator 26 would be high. In that event, the signal 27 would pull down transistor 28 causing the result signal 30 to be low indicating that the test result is a failure.

As can be seen from the foregoing, because the testing of the memory cells is done in parallel and is done inside the memory device 10, the single test result signal 30 which is supplied on the data out pin can indicate the result of the testing of a plurality of memory cells. Since it is expected that successful memory devices 10 would have for the most part successful test result signal 30 indicating a large group of memory cells being successfully tested, it is the rare occasion that the test result signal 30 would indicate failure of one or more memory cells.

What is claimed is:

1. A non-volatile memory device comprising:
    an array of non-volatile memory cells arranged in a plurality of columns and rows;
    a plurality of sense amplifiers, each sense amplifier associated with a column for receiving a signal read from a memory cell in the associated column and for outputting a sensed signal;
    a plurality of latches each for storing a user supplied test signal and for outputting a stored signal;
    a plurality of comparators, each comparator for receiving a sensed signal and a stored signal and for comparing same and for generating a test result signal in response thereto; and
    a logic circuit for receiving a plurality of the test result signals and for generating an output signal in response thereto.

2. The device of claim 1 wherein said logic circuit is an AND circuit.

3. The device of claim 1 wherein said plurality of latches are volatile memory cells.

4. The device of claim 3 wherein each of said volatile memory cells is an SRAM.

5. A method of testing a non-volatile memory device having an array of non-volatile memory cells, comprising:
    inputting a plurality of test signals from a source external to said device
    storing said plurality of test signals in said device;
    reading a plurality of said memory cells from said array to form a plurality of memory signals;
    comparing simultaneously, said plurality of memory signals with said plurality of stored test signals to generate a plurality of test result signals; and
    logically combining said plurality of test result signals to generate an output signal.

6. The method of claim 5 wherein said logically combining step is:
    logically ANDing said plurality of test result signals.

7. In an integrated non-volatile memory semiconductor device having an array of non-volatile memory cells arranged in a plurality of columns and rows, and a plurality of sense amplifiers with associated with a column for receiving the signal read from a memory cell in that associated column, said device having an output pin, wherein said improvement comprising:
    a plurality of latches, integrated with said device, for storing a plurality of test signals supplied from external to said device;
    a plurality of comparators, integrated with said device, with one comparator associated with each sense amplifier and with each latch and for receiving the signals therefrom and for comparing same and for generating a test result signal; and
    a logic circuit, integrated with said device, for receiving a plurality of said test result signals and for generating a single output signal in response thereto, supplied on said output pin.

8. The device of claim 7 wherein said logic circuit is an AND gate.

9. The device of claim 7 wherein said plurality of latches are volatile memory cells.

10. The device of claim 9 wherein each of said volatile memory cells is an SRAM.

* * * * *